Figure 1:
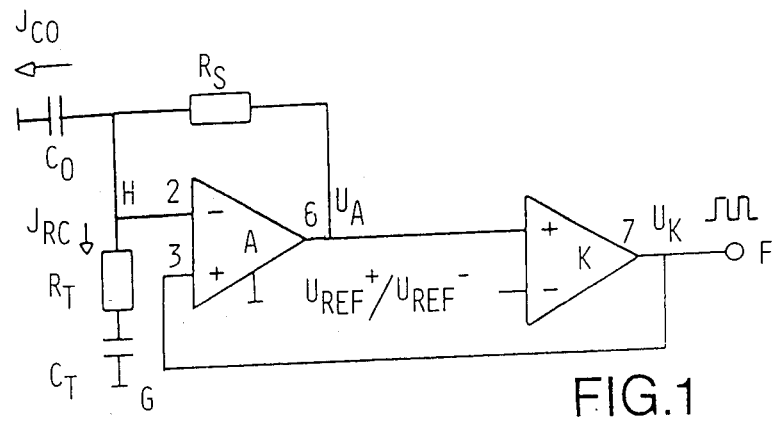

United States Patent [19]

Eilersen

[11] Patent Number: 4,737,706

[45] Date of Patent: Apr. 12, 1988

[54] CAPACITANCE MEASURING CIRCUIT

[76] Inventor: Nils Åge J. Eilersen, Gongehusvej 26, Vedbaek K-2950, Denmark

[21] Appl. No.: 937,397

[22] Filed: Dec. 3, 1986

Related U.S. Application Data

[63] Continuation of Ser. No. 645,324, Aug. 24, 1984, abandoned.

[51] Int. Cl.$^4$ .............................................. G01R 27/26
[52] U.S. Cl. ............................ 324/60 CD; 340/870.37
[58] Field of Search .............. 340/870.37; 324/60 R, 324/60 C, 60 CD, 61 R; 331/36 R, 36 C

[56] References Cited

U.S. PATENT DOCUMENTS

| | | | |
|---|---|---|---|
| 3,581,196 | 5/1971 | Spaid | 324/60 R |
| 3,716,782 | 2/1973 | Henry | 324/60 CD |
| 3,863,147 | 1/1975 | Erath | 324/60 CD |

Primary Examiner—Reinhard J. Eisenzopf
Assistant Examiner—Jose M. Solis
Attorney, Agent, or Firm—Watson, Cole, Grindle & Watson

[57] ABSTRACT

In a remote capacitance measuring circuit comprising an oscillator circuit, the capacitance ($C_T$) to be measured forms a link of a series connected frequency-determining impedance set ($R_T$, $C_T$). This is connected to the oscillator circuit only at its end terminals, one end terminal (G) being connected to a constant voltage, while the other end terminal (H) is connected to a point (2) of the oscillator circuit, where this maintains a constant voltage in each half-cycle. The oscillator circuit senses the charging current flowing to the capacitance ($C_T$) and is triggered at the moment when the charging current has dropped to a predetermined value. Influence of the stray and input impedances (C0) on the oscillator frequency, which is representative of the subject capacitance, is avoided.

8 Claims, 4 Drawing Sheets

CAPACITANCE MEASURING CIRCUIT

This is a continuation of application Ser. No. 645,324 filed Aug. 24, 1984, now abandoned.

The invention relates to a capacitance measuring circuit comprising an oscillator circuit, where the capacitance to be measured forms a link of a series connected frequency-determining set of impedances, which is connected to the oscillator circuit only at the end terminals of the series connection, in the following referred to as the first end terminal and the second end terminal.

From DE-PS No. 27 12 369 C2 and from the periodical "Industriel Teknik" 3-1974, page 27, capacitance measuring oscillator circuits of the kind referred to are known in which a constant current is applied to the series connected set of impedances. In these circuits the voltage across the series connection varies continuously during each half-cycle, and the charge on the stray and input capacitances of the voltage detector will therefore vary during the whole of the half-cycle. This charge is to be delivered by a constant current generator belonging to the circuit, and the charging of the subject capacitance, and thereby the oscillator frequency, will therefore depend on changes of the size of the stray and input capacitances.

It is the object of the invention to devise an oscillator circuit of the kind referred to in such a manner as to be capable of measuring capacitances without undesired influence of the stray and input capacitances of the oscillator circuit, whereby a high stability and linearity of the measurement can be obtained.

This is achieved, according to the invention, by so arranging the circuit that the first end terminal is connected to a constant voltage, while the second end terminal is connected to a point of the oscillator circuit where that circuit maintains a constant voltage during each half-cycle, while at the same time sensing the charging current flowing into the capacitance so as to be triggered at the moment when the charging current thus sensed has dropped to a predetermined value.

It will be seen that when the voltage across the series connection is maintined constant in each half-cycle, the charge on the stray and input capacitances is likewise constant in each half-cycle, and since the recharging of the stray and input capacitances to the constant voltage takes place at the start of each half-cycle, the size of this constant charge and thereby the size of the stray and input capacitances of the oscillator circuit has no influence on the subsequent charging of the subject capacitance and consequently no influence on the frequency of the oscillator circuit, which is representative of the value of the subject capacitance.

Thus, it is a distinguishing feature of the measuring circuit according to the invention that a constant voltage is applied to the frequency-determining series connected impedances, and the frequency is determined by measurement of the charging current of the capacitance, as contrasted to the known capacitance measuring circuits in which a constant current is applied to the frequency-determining series connected impedances, and the frequency is determined by measurement of the voltage.

From GB No. 2.006.442 A a capacitance measuring circuit is known in which the influence of the stray capacitances has been reduced by including the subject capacitance in an integrator connected to a Schmitt-trigger.

Here the series connection of the frequency-determining impedances is not connected to the measuring circuit at its end terminals only, but both terminals of the subject capacitance are connected directly to the output and the inverting input of the amplifier.

Hereby the stray capacitances to ground are in fact eliminated, but the coupling capacitance between the input and the output of the amplifier, which is frequently substantial, is in this case connected directly in parallel to the subject capacitance.

Since this coupling capacitance depends on many parameters, such as temperature, amplification, voltage supply etc., it will have an appreciable influence on the accuracy of measurement.

Besides, this capacitance measuring circuit cannot function with the most widespread group of capacitive transducers, viz. those having one terminal grounded.

Figure 3:
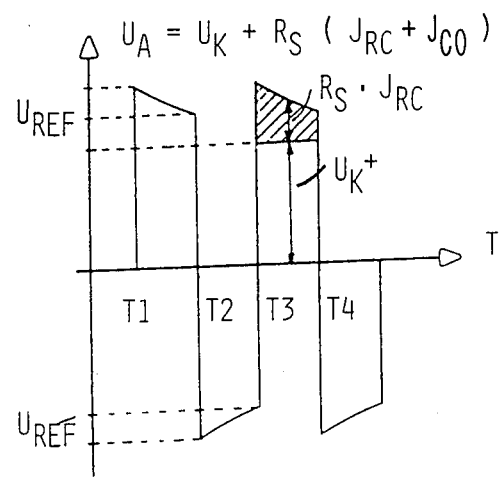
Figure 4:
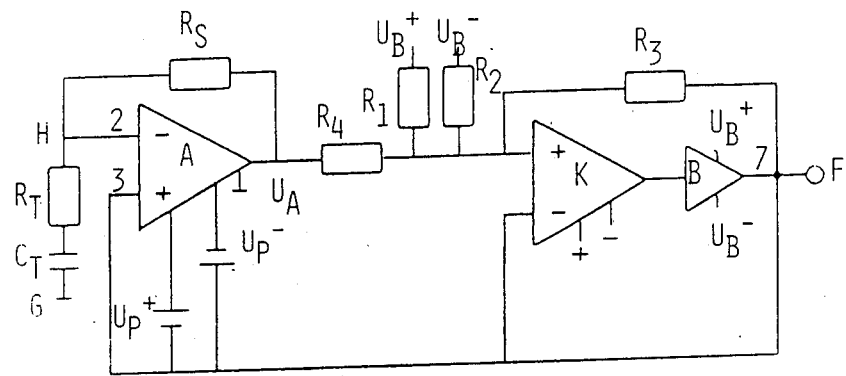
Figure 5:
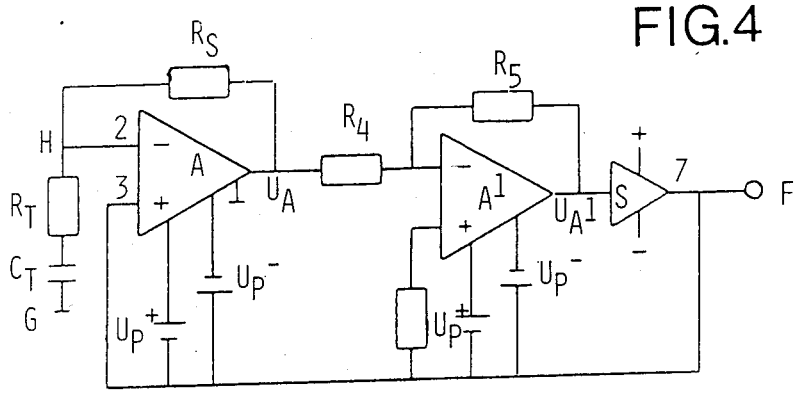

The invention will now be described in further detail with reference to the drawing, in which FIG. 1 shows a particularly advantageous embodiment of the invention, in which the current-sensing, constant-voltage-maintaining circuit consists of an inverting operational amplifier in conjunction with a comparator, FIG. 2 a graph of the output voltage $U_K$ of the comparator of FIG. 1, FIG. 3 a graph of the output voltage $U_A$ of the operational amplifier of FIG. 1, FIG. 4 shows a capacitance measuring circuit according to the invention, illustrating a method of establishing the reference voltage for the comparator, FIG. 5 shows a capacitance measuring circuit according to the invention in which an inverting amplifier is inserted between the current-sensing operational amplifier and the comparator, FIG. 6 a graph of the output voltages $U_A1$ of the inverting amplifier of FIG. 5, FIG. 7 a graph of the output voltage $U_A$ of the comparator of FIG. 5, FIG. 8 a capacitance measuring circuit according to the invention in which the charging current for the series connected frequency-determining impedances is superposed on a constant current, FIG. 9 a capacitance measuring circuit according to the invention with alternative switching of a plurality of series connected frequency-determining sets of impedances to the same current-sensing operational amplifier, and FIG. 10 a capacitanace measuring circuit according to the invention with alternative switching of a plurality of current-sensing operational amplifiers to the same comparator and buffer.

In the capacitance measuring circuit of FIG. 1 one end terminal G of the series connected frequency-determining impedances $R_T C_T$ is connected to a fixed voltage, while their other end terminal H is connected to the inverting input 2 of an operational amplifier A, said input being also connected to the output 6 of the operational amplifier through a resistor $R_S$. The non-inverting input of a comparator K is connected to the output 6 of the operational amplifier, and the inverting input of the comparator is connected to a reference voltage which has the constant positive value $U_{REF}+$ and the constant negative value $U_{REF}-$ in the positive and the negative half-cycle respectively.

Figure 2:
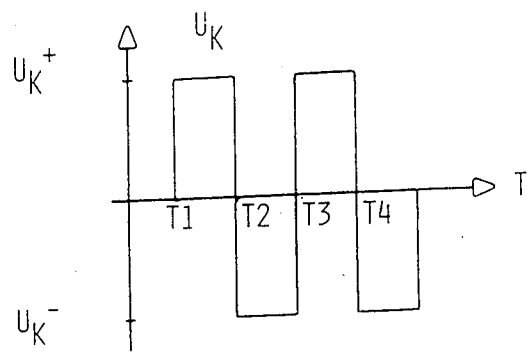

The output 7 of the comparator, which can only assume either the positive maximum voltage $U_K+$ or the negative maximum voltage $U_K-$, cf. the graph of FIG. 2, is connected to the non-inverting input 3 of the operational amplifier.

C0 symbolizes the sum of the stray and input capacitances of the inverting input 2 of the operational amplifier.

Assuming the operational amplifier to be ideal, meaning in the present context that no current flows into the inputs 2 and 3, and that the feed-back through $R_S$ causes the input 2 to assume exactly the same voltage as that applied to the input 3, the function of this capacitance measuring circuit is as follows:

At the time T1, $U_K$ is assumed to have its positive maximum value $U_K+$, which is also applied to the input 3 of the operational amplifier A.

The output 6 consequently assumes a positive voltage which through the resistor $R_S$ will raise the voltage on the input 2, and thereby the voltage across the series connection of $R_T C_T$, to the constant voltage $U_K+$.

This positive voltage change will cause a current $J_{RC}$ to flow into $R_T C_T$ and a current $J_{C0}$ to flow into C0.

Since no current flows into the input 2, the said current must be delivered via $R_S$, and the output voltage $U_A$ of the operational amplifier must therefore assume the value $U_A = U_K+ + R_S(J_{RC} + J_{C0})$.

Both the currents $J_{RC}$ and $J_{C0}$ drop exponentially, and thereby $U_A$ drops, and when suitably selecting the constant value $U_{REF}+$, which can advantageously be made proportional to $U_K+$, $U_A$ will pass $U_{REF}+$, and the output of the comparator will shift to its negative maximum value $U_K-$, which is now applied to the input 3 of the amplifier, cf. the graph of FIG. 3.

As a consequence, the output 6 will assume a negative voltage which through the resistor $R_S$ will lower the voltage on input 2 and thereby on the series connection $R_T C_T$ to the constant voltage $U_K-$.

This negative voltage change will cause a current $J_{RC}$ to flow out of $R_T C_T$ and a current $J_{C0}$ to flow out of C0, and, like before, this current must be delivered via $R_S$, and the output voltage $U_A$ will therefore assume the value $U_A = U_K- - R_S(J_{RC} + J_{C0})$.

Like before, the current drops exponentially, whereby $U_A$ drops, and when suitably selecting the reference voltage, which now has the constant negative value $U_{REF}-$, $U_A$ will pass $U_{REF}-$, and the output of the comparator will be shifted to its positive maximum value $U_K+$, which is again applied to the input 3 and in this manner the oscillations continue at a frequency F.

Owing to the fact that the operational amplifier, through the resistor $R_S$, has almost instantly upon the change-over imposed upon its inverting input 2 the same voltage $U_K$ as that applied to the input 3 from the comparator, the stray capacitance C0 has of course just as promptly been charged to the same constant voltage.

This charging has been effected by the superposition of a current $J_{C0}$ on the current $J_{RC}$, where the duration of $J_{C0}$ is short compared to the duration of $J_{RC}$, because $R_S C0$ normally is much smaller than $R_T C_T$ and because the operational amplifier, with sufficiently high supply voltages, establishes a low impedance virtual ground at input 2 through the resistor $R_S$.

The current $J_{C0}$ does not in any way affect the charging current $J_{RC}$, which is only determined by $C_T$ and the constant voltage $U_K$ and $R_T$, and seeing that, even in the case of great values of C0, the current $J_{C0}$ has dropped to 0 long before the charging current $J_{RC}$ reaches its shifting value, it will be seen that the charging of C0, and thereby the size of C0, has no influence on the voltage $U_A$ at the time of shifting and thus has no influence on the frequency of this measuring circuit according to the invention.

It is hereby shown that the frequency F is determined only by the time constant $R_T C_T$ in conjunction with the resistor $R_S$, the charging voltage $U_K+$ and $U_K-$ and the reference voltages $U_{REF}+$ and $U_{REF}-$, which with modern components can all be made very stable.

The oscillator circuit of FIG. 4 comprises a buffer amplifier B with the voltage supplies $U_B+$ and $U_B-$.

The buffer amplifier has the job of driving the terminal 3 of the operational amplifier A and possibly also of driving the associated frequency measuring equipment.

The comparator voltage $U_K$ has now been replaced by the buffer voltage $U_B$ and is, like before, connected to the input 3 of the operational amplifier A, and is also used as reference for the comparator K.

Since the output voltage of the operational amplifier is $U_A = U_B + R_S J_{RC}$, it will be seen that if $U_A$ is directly applied to the non-inverting input of the comparator, the inputs of the comparator will assume the same voltage only when $J_{RC} = 0$, i.e. the comparator will not change over. p Therefore, a suitable voltage division of $U_A$ is established by means of the resistors $R_1$, $R_2$ and $R_4$, whereby the voltage on the input of the comparator will pass the reference $U_B$ when $J_{RC}$ has dropped to a suitable value.

The resistor $R_3$ has been provided in order to establish a positive feed-back in the comparator, in a manner known per se, so as to make the comparator change over quickly even if the voltage change on the non-inverting input is relatively slow.

The voltage supply $U_p+$ and $U_p-$ to the operational amplifier is so connected as to be bootstrapped with the input 3, when this is changed over between $U_B+$ and $U_B-$.

By this arrangement the advantage is obtained that the voltage on the output of the operational amplifier changes over more quickly since the semiconductor dice and the output follows $U_p+$, $U_p-$ and the input 3 when the buffer changes over between $U_B+$ and $U_B-$, and the operational amplifier output therefore only has to contribute the voltage shift $R_S J_{RC}$. Besides, the advantage is obtained that common mode errors in the operational amplifier are avoided.

In the capacitance measuring circuit of FIG. 5, an inverting amplifier $A^1$ is inserted between the operational amplifier A and the Schmitt-trigger S, where the amplification is determined by the proportion of $R_4$ to $R_5$.

Figure 6:
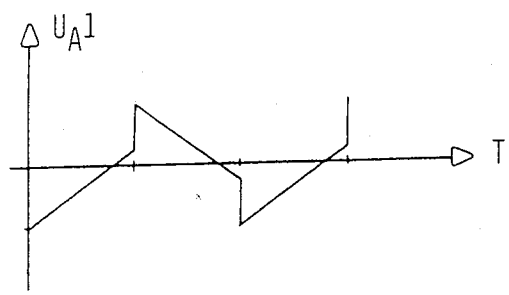
Figure 7:
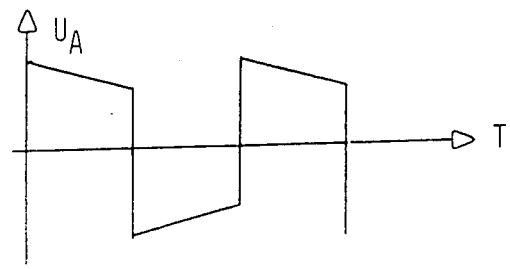

Since the voltage supply $U_p+$, $U_p-$ for both A and $A^1$ is bootstrapped with the output voltage of the Schmitt-trigger and thereby with the voltage on the input 3 of A, the graph of the output voltages $U_A$ and $U_A 1$ will be as shown in FIGS. 6 and 7.

It will be seen that the graph of $U_A 1$ passes the value 0 at dropping current $J_{RC}$, and for this reason the comparator can be replaced by the Schmitt-trigger S which acts as a comparator with hysteresis and the reference voltage 0.

By this measuring circuit according to the invention the further advantage is obtained that the voltage supplied to the Schmitt-trigger/comparator is amplified.

Figure 8:
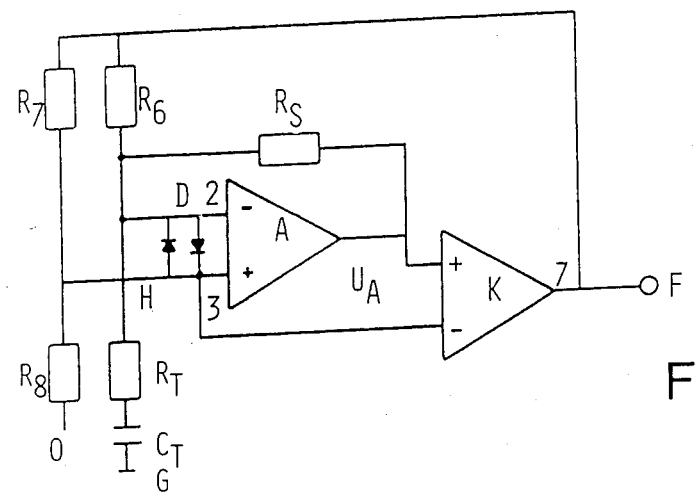

Another method of avoiding subdivision of the voltage $U_A$ and still making the input voltage of the comparator pass the reference voltage during the discharging of $C_T$ is shown in FIG. 8, where the resistor $R_6$ provides a constant positive and a constant negative current into the frequency-determining series connected impedances in the positive and the negative half-cycle, respectively.

When this current exceeds $J_{RC}$, the output voltage $U_A$ will shift in relation to the voltage on the input 3 of the operational amplifier and thereby in relation to the reference voltage of the comparator, which is determined by voltage division between $R_7$ and $R_8$.

FIG. 8 also shows two diodes D connected in anti-parallel and serving to obtain the fastest possible charging of the stray and input capacitances on input 2 of the amplifier A. This is of importance when these capacitances assume very high values so that the time for charging C0 through $R_S$ alone is comparable to the time constant $R_T C_T$. These diodes can of course also be used in the other capacitance measuring circuits according to the invention shown in the drawing.

Figure 9:
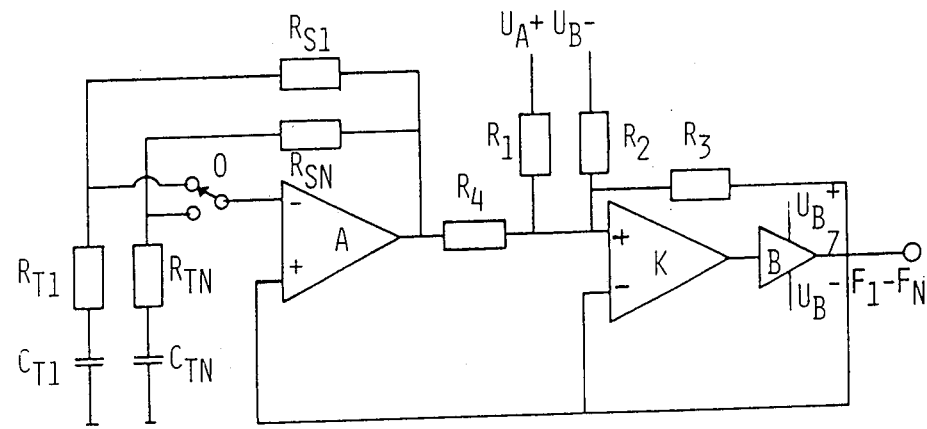

In the use of the capacitance measuring circuit according to the invention it is possible, as illustrated in FIG. 9, in a simple manner to connect a plurality of sets of series connected frequency-determined impedances $R_{T1}, C_{T1} - R_{TN}, C_{TN}$ successively to the same current-sensing operational amplifier, seeing that, as explained above, the stray capacitances from supply conductors and switches have no influence on the frequencies $F_1 - F_N$.

Hereby a succession of frequencies is obtained, which by suitable calculation, e.g. in a computer connected to the circuit, can be used for determining a function of the various capacitances $C_{T1} - C_{TN}$ and to eliminate drifting and ageing of the components common to a plurality of measurements, such as the amplifier A, the comparator K and the resistors $R_1$, $R_2$, $R_3$ and $R_4$.

Figure 10:
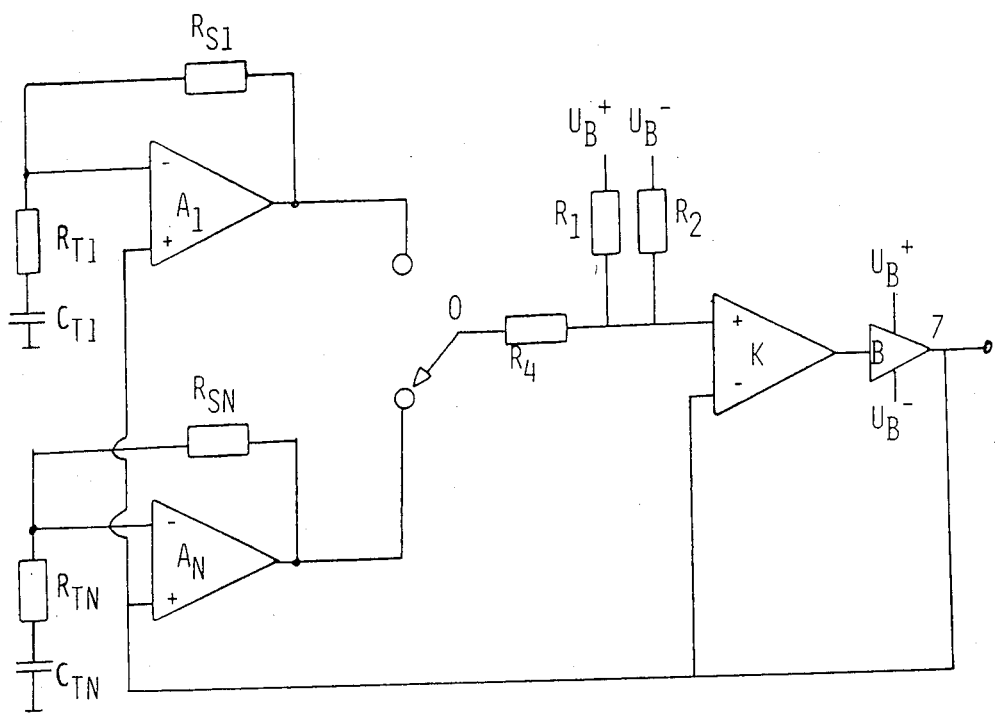

At high temperatures leakage currents from the switches in FIG. 9 may, however, affect the charging of the subject capacitances, and it may then be advantageous to connect two or more current-sensing operational amplifiers $A_1 - A_N$ through a switch 0 to a common comparator K and buffer B, as shown in FIG. 10.

In the capacitance measuring circuit according to the invention, the series connected frequency-determining impedances may in principle be RC, LC or RCL combinations or mechanical resonators.

However, a great advantage is obtained by using a RC-oscillator, because the frequency of this is proportional to the electrode spacing of a capacitive transducer. This is, however, only the case when the influence from the stray and input capacitances can be eliminated, such as has been achieved by the present invention.

An advantage can also be obtained by connecting series connected reference impedane sets, having a fixed, known value, to a capacitance measuring circuit according to the invention in succession with the subject impedance sets. These reference impedance sets may deliver signals which can be utilized for the complete correction for drifting in the components common to a plurality of measurements, and for producing fault indication signals, if as a consequence of faults the signal frequencies from one or more subject impedance sets go beyond certain tolerances relatively to the reference frequencies.

The use of reference impedance sets also makes it possible to perform an accurate absolute measurement of capacitances.

In the practical use of the measuring circuit according to the invenion it may be particularly advantageous to arrange the resistor $R_T$ with one supply terminal directly on the capacitor electrode of a capactive transducer, whereby stray capacitances in the point of junction of the series connection are totally avoided.

The other end of $R_T$ may, owing to the advantageous properties of the capacitance measuring circuit, be connected to this circuit through a relatively long conductor, such as is in practice frequently desirable.

As will be seen, the measuring circuit according to the invention can in a simple manner provide a stable and linear measuring result which is accurately representative of the subject capacitance.

I claim:

1. A capacitance gauging circuit, comprising:
an oscillator circuit having a gauging point;
a series-connected set of impedances including a capacitance to be measured being connected between said gauging point and a permanently constant voltage and not otherwise connected;
voltage driving means for driving said gauging point from high to low constant voltage and vice-versa during the transition between semiperiods of oscillation, thereby to start charging of both the capacitance to be measured and parasitic capacitances occurring at said gauging point;
a current-sensing element being provided in the path of charging of said capacitance to be measured; and
means for triggering said oscillator circuit at the moment when a charging current sensed by said current-sensing element has reached a predetermined value, the arrangement being such that the charging speed for said parasitic capacitances is substantially higher than the charging speed for said capacitance to be measured.

2. A capacitance gauging circuit as in claim 1, in which said driving means comprises an operational amplifier, the inverting input of which constitutes said gauging point, an impedance being connected between the output and the inverted input of said operational amplifier to form said current-sensing element, a regenerative circuit element being connected to the output of the operational amplifier in such a manner that upon the charging current through said current-sensing element attaining said predetermined value the output voltage of said operational amplifier triggers said regenerative circuit element, the latter having an output coupled back to the non-inverting input of said operational amplifier.

3. A capacitance gauging circuit as in claim 2, in which two diodes are connected in anti-parallel between the inverting input and the non-inverting input of said operational amplifier.

4. A capacitance gauging circuit as in claim 2, in which said regenerative circuit element comprises a comparator, the non-inverting input of which is coupled to the output of said operational amplifier, while its inverting input is coupled to a source of positive and negative reference potential.

5. A capacitance gauging circuit as in claim 4, in which said regenerative circuit element further comprises a buffer amplifier connected to the output of said comparator, the output of said buffer amplifier constituting the output of said regenerative circuit element and also serving as source of reference potential for said comparator.

6. A capacitance gauging circuit as in claim 4, comprising a Schmitt-trigger constituting said comparator, and an inverting amplifier inserted between said operational amplifier and said Schmitt-trigger.

7. A capacitance gauging circuit, comprising:
an oscillator circuit having a gauging point;
a plurality of series-connected sets of impedances, each including a capacitanace to be measured, being alternatively connectable between said gauging point and a permanently constant voltage and not otherwise connected;
voltage driving means for driving said gauging point from high to low constant voltage and vice-versa during the transition between semiperiods of oscillation, thereby to start charging of both the respective capacitance to be measured and parasitic capacitances occurring at said gauging point;
a current-sensing element being provided in the path of charging of the respective capacitance to be measured; and
means for triggering said oscillator circuit at the moment when a charging current sensed by said current-sensing element has reached a predetermined value, the arrangement being such that the charging speed for said parasitic capacitance is substantially higher than the charging speed for each of said capacitances to be measured.

8. A capacitance gauging circuit, comprising:
a plurality of operational amplifiers;
a series-connected set of impedances including a capacitance to be measured being connected between the inverting input of each operational amplifier and a permanently constant voltage and not otherwise connected;
an impedance being connected between the output and the inverting input of each operational amplifier to form a current-sensing element;
a regenerative circuit element having an inverting input, a non-inverting input and an output, the outputs and non-inverting inputs of said operational amplifiers being alternatively connectable across the non-inverting input and the output, respectively, of said regenerative circuit element to form alternative oscillator circuits, in each of which, when in operation, the operational amplifier therein acts as a voltage driving means for driving said inverting input of the operational amplifier from high to low constant value and vice-versa during the transition between semiperiods of oscillation, thereby to start charging of both the respective capacitance to be measured and parasitic impedances occurring at the inverting input of the respective operational amplifier;
the respective current-sensing element lies in a charging path of the respective capacitance to be measured, the arrangement being such that the charging speed for the respective parasitic capacitances is substantially higher than the charging speed for the respective series-connected capacitance to be measured; and
means for triggering the respective oscillator circuit at a moment when the charging current sensed by the respective current sensing element has reached a predetermined value.

* * * * *